US012604208B2

(12) United States Patent
Wakao et al.

(10) Patent No.: US 12,604,208 B2
(45) Date of Patent: Apr. 14, 2026

(54) LEARNING METHOD, WIRELESS QUALITY ESTIMATION METHOD, LEARNING DEVICE, WIRELESS QUALITY ESTIMATION DEVICE, AND PROGRAM

(71) Applicant: NTT, Inc., Tokyo (JP)

(72) Inventors: Keisuke Wakao, Tokyo (JP); Kenichi Kawamura, Tokyo (JP); Takatsune Moriyama, Tokyo (JP)

(73) Assignee: NTT, Inc., Tokyo (JP)

( * ) Notice: Subject to any disclaimer, the term of this patent is extended or adjusted under 35 U.S.C. 154(b) by 427 days.

(21) Appl. No.: 18/245,962

(22) PCT Filed: Nov. 6, 2020

(86) PCT No.: PCT/JP2020/041520
§ 371 (c)(1),
(2) Date: Mar. 20, 2023

(87) PCT Pub. No.: WO2022/097270
PCT Pub. Date: May 12, 2022

(65) Prior Publication Data
US 2023/0388812 A1    Nov. 30, 2023

(51) Int. Cl.
*H04W 16/18* (2009.01)
*G01R 29/10* (2006.01)

(52) U.S. Cl.
CPC ............ *H04W 16/18* (2013.01); *G01R 29/10* (2013.01)

(58) Field of Classification Search
CPC ...... H04W 16/18; H04W 24/08; G01R 29/10; G06N 3/08

USPC ........................................................ 370/329
See application file for complete search history.

(56) References Cited

U.S. PATENT DOCUMENTS

| | | | |
|---|---|---|---|
| 10,908,299 B1 * | 2/2021 | Tadayon | H04W 4/027 |
| 2018/0101770 A1 | 4/2018 | Tanaka et al. | |
| 2022/0123848 A1 | 4/2022 | Inoue et al. | |

FOREIGN PATENT DOCUMENTS

| | | |
|---|---|---|
| JP | H10-213644 | 8/1998 |
| JP | 2010-166185 | 7/2010 |
| JP | 2018-063504 | 4/2018 |
| WO | 2020/153221 | 7/2020 |
| WO | 2020/188971 | 9/2020 |

OTHER PUBLICATIONS

Toshihiro Kamishima, "Open Transfer Learning", Artificial Intelligence, vol. 25 No. 4, Jul. 2010.

* cited by examiner

*Primary Examiner* — Ricky Q Ngo
*Assistant Examiner* — Meheret Woldegebreal Kidane
(74) *Attorney, Agent, or Firm* — IPUSA, PLLC

(57) ABSTRACT

A learning method in which a learning device performs learning on a model for estimating wireless quality by machine learning, and the learning method includes a learning step of generating a pre-trained model by performing the learning on the model by using measurement data of wireless quality obtained by a plurality of terminals, and a retraining step of retraining the pre-trained model by using measurement data satisfying a predetermined condition.

8 Claims, 9 Drawing Sheets

HEAT MAP OF RADIO WAVE RECEPTION INTENSITY/WIRELESS COMMUNICATION QUALITY

HEAT MAP OF RADIO WAVE RECEPTION INTENSITY/WIRELESS COMMUNICATION QUALITY

TRAVEL ROUTE

AUTONOMOUS VEHICLE

ESTIMATE WIRELESS QUALITY AT SCHEDULED DESTINATION

Figure 5:
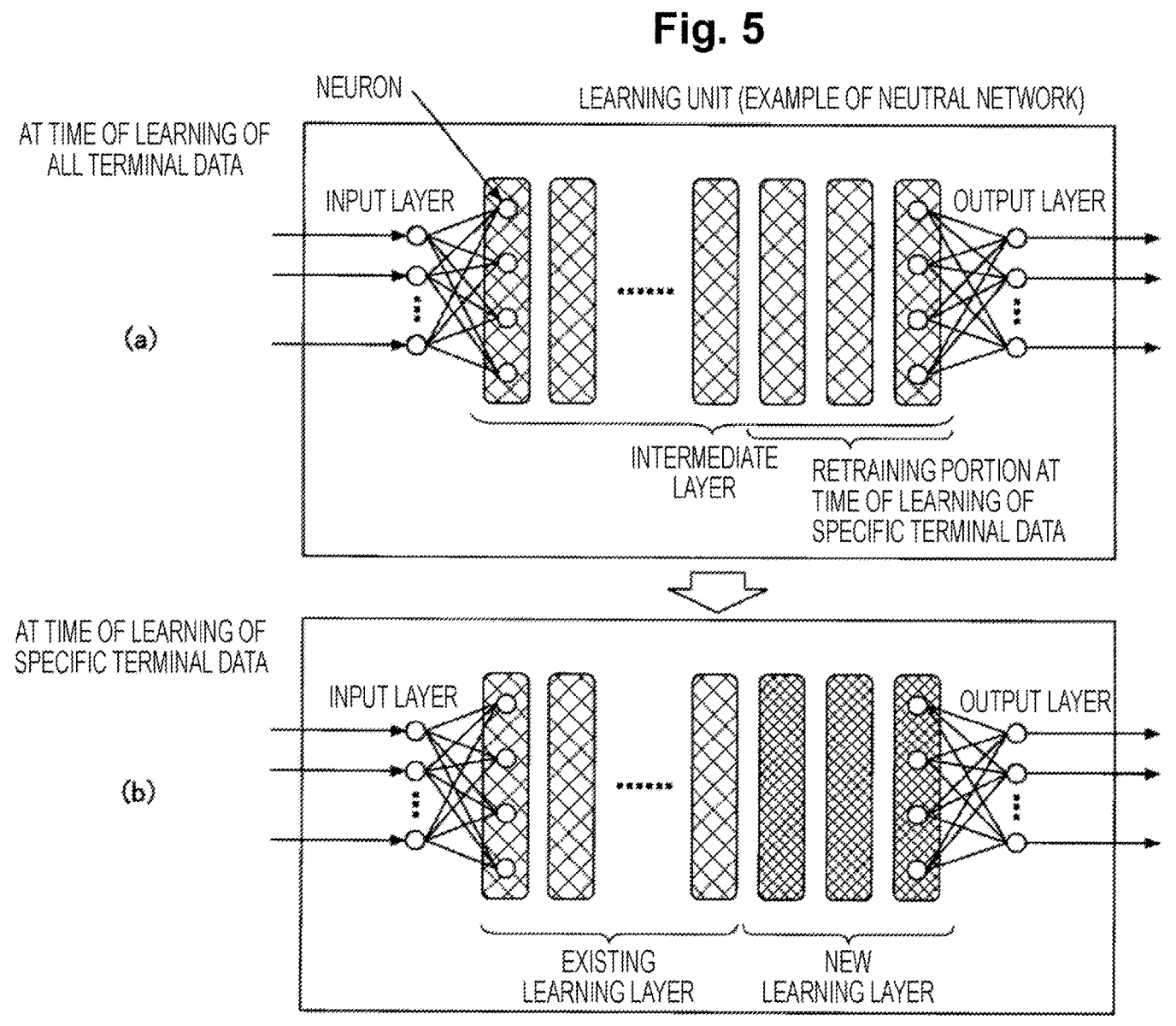

LEARNING UNIT (EXAMPLE OF NEUTRAL NETWORK)

(a) AT TIME OF LEARNING OF ALL TERMINAL DATA

NEURON

INPUT LAYER

OUTPUT LAYER

INTERMEDIATE LAYER

RETRAINING PORTION AT TIME OF LEARNING OF SPECIFIC TERMINAL DATA (b) AT TIME OF LEARNING OF SPECIFIC TERMINAL DATA

INPUT LAYER

OUTPUT LAYER

EXISTING LEARNING LAYER

NEW LEARNING LAYER

START

EXTRACT DATA OF TARGET SPECIFIC TERMINAL FROM DATA RECORDED IN DATABASE UNIT ~S201

DESIGNATE RANGE OF NEURAL NETWORK LAYER TO BE RETRAINING PORTION AT TIME OF LEARNING DATA FOR LEARNING UNIT ~S202

INPUT EXTRACTED DATA IN LEARNING UNIT IN WHICH RETRAINING PORTION IS SET, AND EXECUTE LEARNING USING MACHINE LEARNING ALGORITHM OF LEARNING UNIT ~S203

END

LEARNING METHOD, WIRELESS QUALITY ESTIMATION METHOD, LEARNING DEVICE, WIRELESS QUALITY ESTIMATION DEVICE, AND PROGRAM

TECHNICAL FIELD

The present invention relates to a technique for estimating wireless quality in a terminal that performs wireless communication.

BACKGROUND ART

In wireless communication, wireless quality of a terminal changes due to various factors such as reception power of radio waves at a receiver, interference from surroundings, and a communication volume of other terminals communicating on the same channel.

With respect to the above, in a case where wireless communication is used for transmission of a control signal in applications such as autonomous driving of an automobile, automatic delivery robot, and control of a drone, continuous stable communication quality is required. In such applications, prior estimation of the wireless quality is enabled. For example, in a case where radio waves deteriorate and communication quality decreases at a future destination of the autonomous vehicle, it is possible to perform control such as reducing the speed to prevent a serious accident.

Regarding the estimation of the wireless quality in such an application, as one of the conventional methods, there is a method of detecting quality deterioration based on a measurement result of quality such as radio wave intensity onsite (this technique is referred to as "related art 1").

However, if the determination is made only based on the measurement result, the action is taken after the actual deterioration, and thus the determination may be delayed. Therefore, it is effective to predict the deterioration of the wireless quality and to take an action before the deterioration.

In addition, as a method of estimating and visualizing wireless quality in advance, there is a method of measuring, in advance, by using a terminal for measurement, reception power and communication quality of radio waves at a place where the terminal is to be actually used, and constructing a database together with position information. Such a database is referred to as a heat map.

In the estimation of the quality using such a heat map, there is a possibility that the measurement points are not necessarily continuous due to time constraints, physical constraints, or the like, and in this case, calculation to complement the measurement points is performed. A quality estimation value in a terminal to be actually used is obtained by predicting a future travel position and obtaining a value corresponding to the position from a heat map (this technology is referred to as "related art 2").

CITATION LIST

Non Patent Literature

Non Patent Literature 1: Toshihiro Kamishima, "Open Transfer Learning", Artificial Intelligence, Vol. 25 No. 4, July 201

SUMMARY OF INVENTION

Technical Problem

Related art 1 has an issue that deterioration of wireless quality cannot be known in advance. In addition, in related art 2, wireless quality deterioration can be predicted in advance to some extent, but it is necessary to create a map of quality measurement in advance. At this time, the more the number of measurement points is, the more accurate the heat map is, and using the result measured by the terminal to be actually used makes the heat map more accurate since there is no difference in the characteristics between the terminals. However, it is often difficult to perform measurement in advance using a terminal to be actually used.

It is also conceivable to estimate the wireless quality using a model obtained by machine learning. In machine learning, it is desirable to perform learning using measurement data obtained under a condition close to a condition of actually performing estimation (desired condition), but it is often difficult to prepare a large amount of such measurement data. Therefore, the measurement data acquired under a condition different from the desired condition is used, but learning using the measurement data acquired under the different condition is inefficient, and the accuracy of the estimation result of the wireless quality is also low.

The present invention has been made in view of the above points, and an object of the invention is to provide a technique capable of accurately estimating wireless quality even with the small amount of measurement data obtained under a desired condition.

Solution to Problem

According to the disclosed technology, there is provided a learning method in which a learning device performs learning on a model for estimating wireless quality by machine learning, the learning method including:

a learning step of generating a pre-trained model by performing the learning on the model by using measurement data of wireless quality obtained by a plurality of terminals; and a retraining step of retraining the pre-trained model by using measurement data satisfying a predetermined condition.

Advantageous Effects of Invention

According to the disclosed technology, there is provided a technique capable of accurately estimating wireless quality even with the small amount of measurement data obtained under the desired condition.

BRIEF DESCRIPTION OF DRAWINGS

FIG. 2 is of a wireless quality estimation system in the embodiment of the present invention

FIG. 5 is a diagram illustrating learning of specific terminal data by transfer learning.

DESCRIPTION OF EMBODIMENTS

Hereinafter, an embodiment of the present invention (a present embodiment) will be described with reference to the drawings. The embodiment described below is merely an example, and embodiments to which the present invention is applied are not limited to the following embodiment.

In the following description, wireless communication quality, such as radio wave reception intensity and throughput, is collectively referred to as "wireless quality".

In the following description, a neural network model (which may be referred to as a learning machine) is used for estimation of wireless quality, but this is an example. A model obtained by machine learning other than the neural network may be used.

Furthermore, in the following description, transfer learning is used as a method of retraining for a pre-trained model, but this is also an example. As a method of retraining, for example, fine tuning may be used.

Overview of the Present Embodiment

Figure 1:
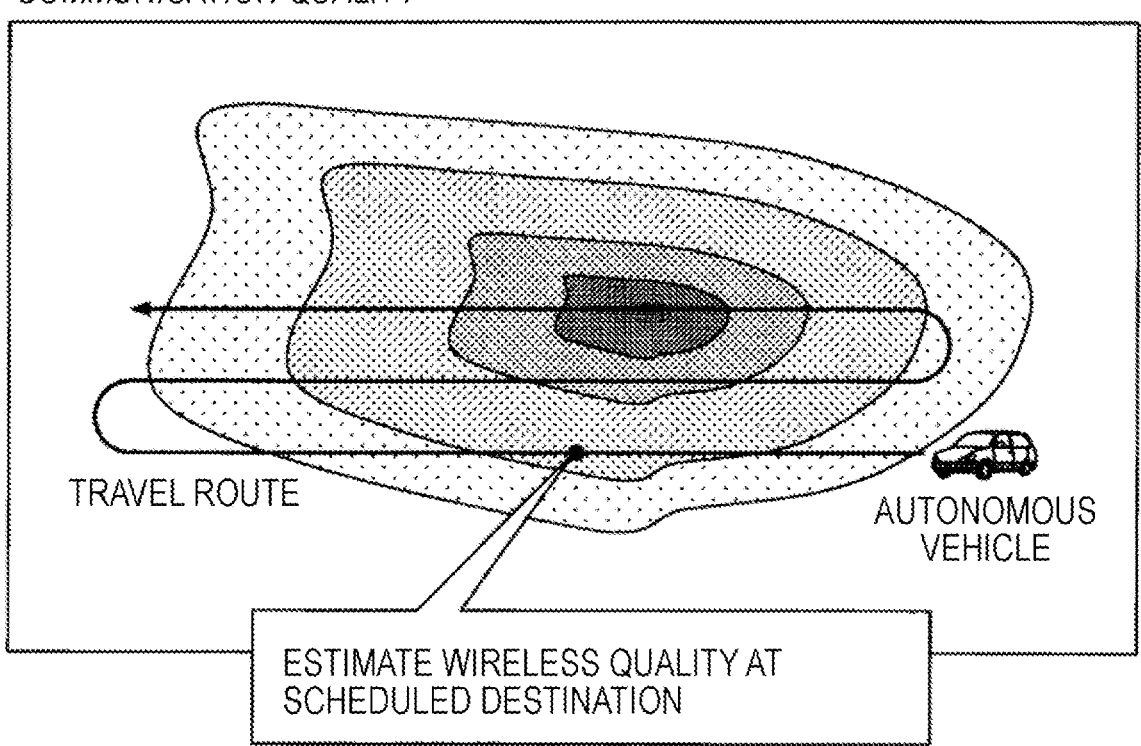
FIG. 1 is a diagram for explaining an overview of an embodiment of the present invention.

FIG. 1 illustrates an example of a case where a wireless quality estimation result is used to assist autonomous driving. FIG. 1 illustrates an image of estimating the wireless quality at the destination by using a heat map of the wireless quality.

As illustrated in FIG. 1, the wireless quality is predicted on the scheduled travel route of an autonomous vehicle. If such a heat map can be created with high accuracy, the wireless quality at the destination of the autonomous vehicle can be estimated with high accuracy. However, in order to create a heat map with high accuracy, a large amount of preliminary measurement data under a desired condition is required. The desired condition is, for example, performing measurement using a terminal to be actually used for wireless communication in the autonomous vehicle.

However, as described above, it is often difficult to obtain a large amount of preliminary measurement data by using the terminal to be actually used. For example, in an application in which harvest of crops is automated by autonomous driving of a tractor, in a case where remote control and monitoring are performed using wireless communication, it is necessary to create a heat map of wireless quality in advance using the tractor in advance at a time when there is no crop, and the operation is difficult.

Therefore, in the present embodiment, first, pre-training by machine learning is performed on the basis of a large amount of measurement data collected from various terminals other than terminals to be actually used (terminals to be actually used may be included), and a model (referred to as a "pre-trained model") is created.

Further, the transfer learning is performed on the pre-trained model using the measurement data collected from the terminal to be actually used (or the terminal close to the terminal to be actually used), and using the model obtained by the transfer learning (referred to as a "transfer trained model"), the wireless quality of the terminal to be actually used is estimated.

Accordingly, even with a small amount of measurement data collected from the terminal to be actually used (or the terminal close to the terminal to be actually used), wireless quality can be estimated with high accuracy. Hereinafter, a device configuration and processing contents in the present embodiment will be described in more detail.

Device Configuration Example

Figure 2:
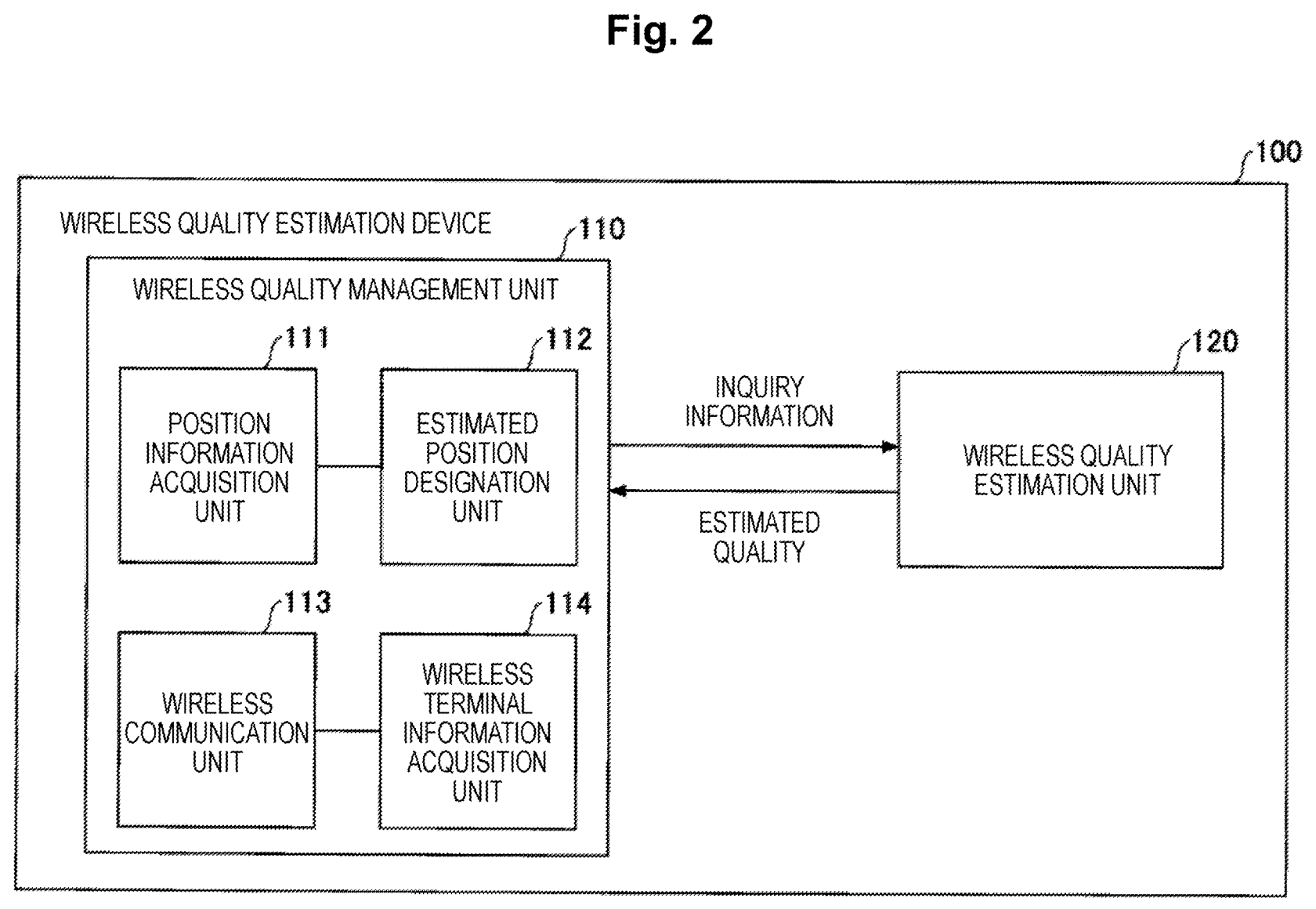

FIG. 2 illustrates a configuration example of a wireless quality estimation device 100 in the present embodiment. The wireless quality estimation device 100 is a device that estimates wireless quality of a terminal to be actually used for wireless communication (for example, a terminal mounted on an autonomous vehicle for wireless communication).

The wireless quality estimation device 100 may be provided in an autonomous vehicle or the like together with a terminal to be actually used for wireless communication, or the wireless quality estimation device 100 may be provided as a function in a terminal to be actually used for wireless communication. In addition, a wireless quality management unit 110 in the wireless quality estimation device 100 may be a terminal to be actually used for wireless communication.

As illustrated in FIG. 2, the wireless quality estimation device 100 according to the present embodiment includes the wireless quality management unit 110 and a wireless quality estimation unit 120. Note that the "wireless quality estimation device" may be referred to as a "wireless quality estimation system".

The wireless quality estimation device 100 according to the present embodiment is mounted on, for example, an autonomous vehicle as described above, and is connected to the operation system via a network (a communication line). However, such a form is merely an example. The wireless quality estimation device 100 may be provided in a general vehicle other than the autonomous vehicle, or the function of the wireless quality estimation device 100 may be provided in a terminal that performs wireless communication.

Hereinafter, a description will be given assuming that the wireless quality estimation device 100 and a terminal that is actually used and that is a target of wireless quality estimation (referred to as a "terminal A") are provided in a nearby place (for example, in the autonomous vehicle).

The wireless quality management unit 110 and the wireless quality estimation unit 120 in the wireless quality estimation device 100 may be mounted in different devices and connected using a communication line. In a case where the wireless quality management unit 110 and the wireless quality estimation unit 120 are mounted separately in different devices, the "wireless quality management unit" may be referred to as a "wireless quality management device", and the "wireless quality estimation unit" may be referred to as a "wireless quality estimation device". In addition, the "wireless quality estimation unit" or the "wireless quality estimation device" may be referred to as a "learning device".

In addition, in the present embodiment, the wireless quality estimation unit 120 performs both the learning of the model and the wireless quality estimation using the model, but a functional unit that performs the learning of the model and a functional unit that performs the wireless quality estimation using the model may be separately provided. For example, a functional unit that performs learning on a model (which may be referred to as a learning device) and a functional unit that performs wireless quality estimation using the model (which may be referred to as a wireless quality estimation device) may be connected via a communication line, and the transfer trained model may be transmitted from the functional unit that performs learning on the model (the learning device) to the functional unit that performs wireless quality estimation using the model (the wireless quality estimation device).

<Wireless Quality Management Unit 110>

As illustrated in FIG. 2, the wireless quality management unit 110 includes a position information acquisition unit 111, an estimated position designation unit 112, a wireless communication unit 113, and a wireless terminal information acquisition unit 114.

The position information acquisition unit 111 acquires a geographical position (latitude, longitude, and altitude) and speed information of the terminal A, travel direction information of the terminal A, and the like by a sensor such as a GPS. Furthermore, the estimated position designation unit 112 determines a geographical position (latitude, longitude, and altitude) at which the wireless quality is desired to be acquired. The estimated position designation unit may be referred to as a position estimation unit.

As this determination method, there is a determination method of estimating and designating a destination position after a predetermined time based on a current position of the terminal A acquired by the position information acquisition unit 111, the speed information, and the travel direction information, or retaining travel route information of the terminal A in advance and determining a destination after a predetermined time from comparison with the current position, or the like.

The wireless communication unit 113 is a device that performs wireless communication of various wireless communication standards. The wireless terminal information acquisition unit 114 is a functional unit that acquires and stores terminal information (information such as a terminal device model, wireless communication standards information, antenna characteristic information, and the like) of the terminal A.

<Wireless Quality Estimation Unit 120>

Figure 3:
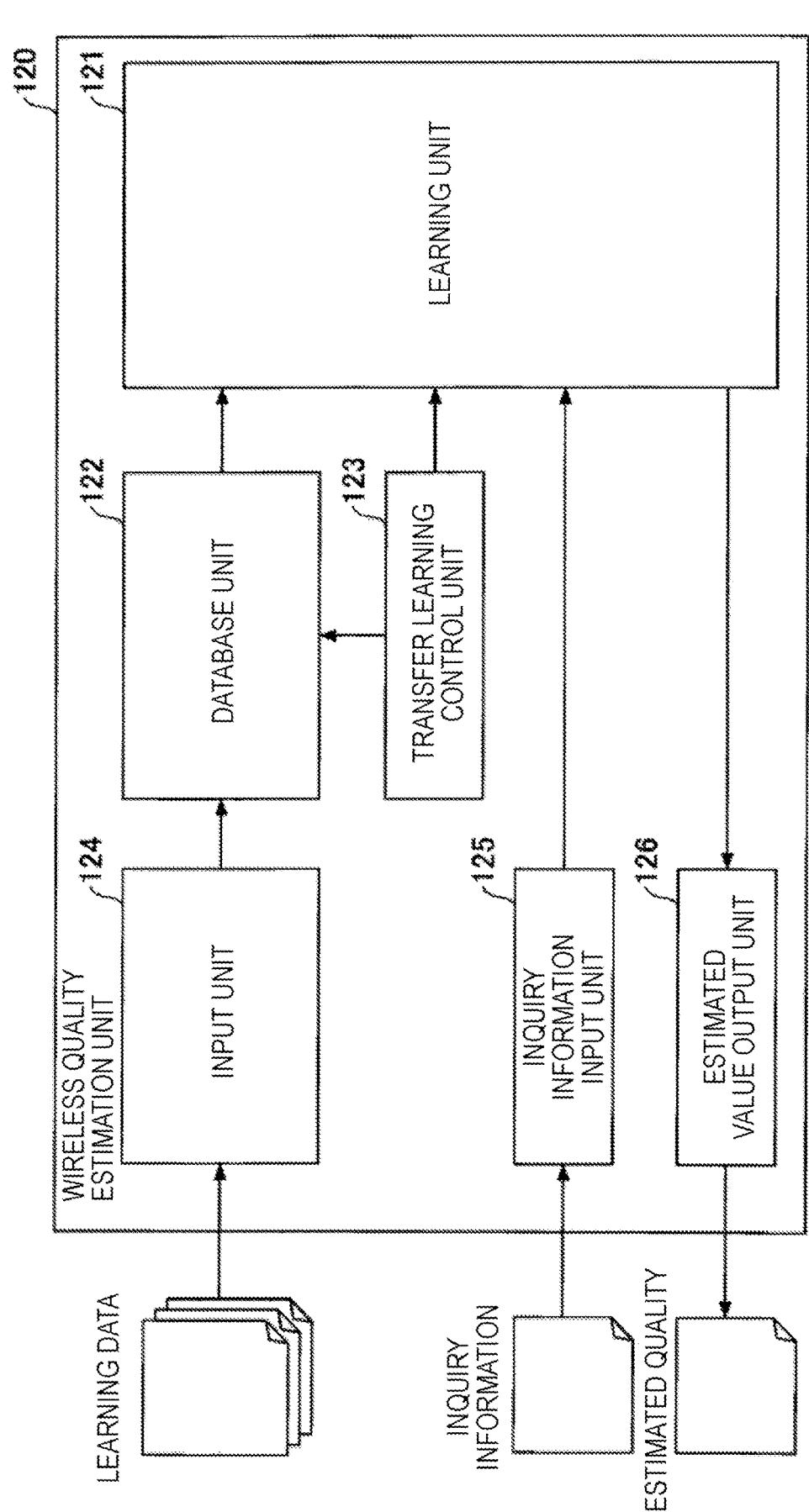
FIG. 3 is a diagram illustrating a configuration example of a wireless quality estimation unit.

FIG. 3 illustrates a functional configuration example of the wireless quality estimation unit 120. As illustrated in FIG. 3, the wireless quality estimation unit 120 includes a learning unit 121, a database unit 122, a transfer learning control unit 123, an input unit 124, an inquiry information input unit 125, and an estimated value output unit 126. The transfer learning control unit may be referred to as a learning control unit.

As described above, in the present embodiment, a machine learning technique is used to estimate wireless quality. The learning unit 121 is a functional unit on which a machine learning algorithm is implemented, and specifically performs learning on a model including a neural network. More specifically, the model including the neural network includes a weight parameter, a function, and the like, and is implemented by software. By learning the model, the weight parameter is adjusted to be optimal.

The database unit 122 includes a database unit 122 that accumulates learning data. The input unit 124 inputs data for learning and stores the data in the database unit 122.

The inquiry information input unit 125 inputs inquiry information (the position information and the terminal information for which estimation is desired) and passes the inquiry information to the learning unit 121. The learning unit 121 inputs the inquiry information to the transfer trained model, and obtains an estimated value of the wireless quality as an output from the model.

The estimated value is passed from the learning unit 121 to the estimated value output unit 126. The estimated value output unit 126 outputs the estimated value of the wireless quality. The output estimated value is transmitted to the operation system, for example, and is used for operation control or the like in the autonomous vehicle on which the terminal A is mounted.

Here, the estimated value of the wireless quality is an estimated value of the wireless quality such as an estimated reception power value, throughput, delay, and jitter at the position indicated by the input position information. These estimated values each may be an estimated value of an average value or a median value, may be an estimated value of a maximum value or a minimum value, or may be other values.

<Details of Learning>

Hereinafter, model learning in the present embodiment will be described in more detail with reference to the transfer learning control unit 123.

The transfer learning control unit 123 performs control for causing the learning unit 121 to perform transfer learning for the pre-trained model.

Figure 4:
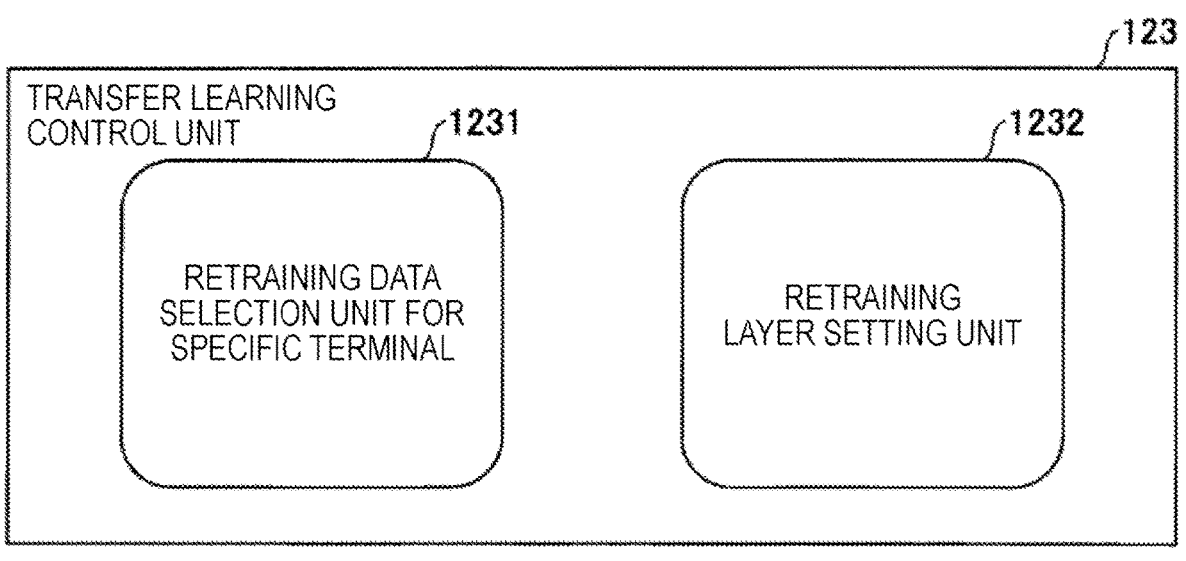
FIG. 4 is a diagram illustrating a configuration example of a transfer learning control unit.

FIG. 4 illustrates a functional configuration example of the transfer learning control unit 123. As illustrated in FIG. 4, the transfer learning control unit 123 includes a retraining data selection unit for a specific terminal 1231 and a retraining layer setting unit 1232.

The retraining data selection unit for a specific terminal 1231 selects data of a terminal close to the terminal A, which is a target of the wireless quality estimation, from among the data stored in the database unit 122. In addition, the retraining layer setting unit 1232 configures, under a predetermined condition, the range of neurons to which retraining is applied in the model of the pre-trained neural network.

An operation example of learning in the learning unit 121 will be described with reference to FIG. 5. Note that the example illustrated in FIG. 5 illustrates an example of a case of using a model of a neural network including an input layer, an output layer, and one or more intermediate layers. Each layer has one or more neurons (which may also be referred to as nodes).

In the present embodiment, first, as illustrated in FIG. 5($a$), the learning unit 121 performs learning on the model by using the measurement data of all the terminals stored in the database unit 122. This learning is called pre-training. The all terminals are not limited to the terminals A, and are all terminals that have measured the collected measurement data.

Here, by inputting a set of "location information, terminal information, and wireless quality information" for each terminal as features to the learning unit 121, the weight parameter of each layer of the model of the neural network is optimized by learning. More specifically, the position information and the terminal information are input to the model, and the weight parameter is adjusted so as to minimize an error between the output of the information and the wireless quality information which is correct data.

The position information described above is information on a position measured by the terminal, and is information represented by latitude and longitude information, and the like obtained by GPS or the like, and the terminal information is device model information (which may be referred to as type information) of the terminal, standards information of a wireless interface, antenna type information, and the like. In addition, the wireless quality information is actually-measured quality information such as reception power information, throughput, delay, and jitter for each wireless base station to which the terminal is connected.

By the above learning, a model corresponding to the position of the terminal and the terminal information is created. In this learning, the more the learning data (the measurement data) of the terminal A, which is the target of the wireless quality estimation, is provided, the more accurate the estimation result by this model becomes.

Therefore, it is effective to acquire and learn a large amount of measurement data of the wireless quality of terminals A in advance. However, it is practically difficult to accumulate enormous amounts of measurement data in advance in the terminal A for which the estimation is desired.

Therefore, in the present embodiment, a general terminal such as a smartphone is used as a terminal other than the terminal A, and measurement data is collected from terminals of a large number of users and stored in the database unit 122. As a result, a large amount of measurement data can be collected, but the data is data having variations such as a difference in type of the m wireless terminal, a difference in antenna performance, and how the terminal is held at the time of measurement. Therefore, an error occurs between the wireless quality estimated by the model trained by such data and the actual wireless quality of the terminal A, which is the target of the wireless quality estimation.

Therefore, in the present embodiment, transfer learning is performed on a model on which the preliminary learning has been performed using measurement data obtained from terminals of a large number of users to create a transfer trained model (a retrained model).

In the transfer learning, the transfer learning control unit 123 selects measurement data of a terminal close to the terminal A, which is the target of the wireless quality estimation, from among the measurement data stored in the database unit 122, and sets a range of a layer in a model of a neural network that is a retraining portion in the transfer learning, in the learning unit 121.

In the example of FIG. 5(b), three intermediate layers before the output layer are set as the retraining portion of the transfer learning. As described above, the setting of the retraining portion may be performed in units of layers, or the retraining portion may be set more finely in units of neurons in the layers. In any case, the range of neurons in the neural network is designated as the retraining portion.

Regarding the portion in the pre-trained model to be set as the retraining portion, it may be a predetermined portion (for example, three intermediate layers before the output layer), an optimal retraining portion may be determined by performing an experiment, or it may be determined by another method.

In the transfer learning (retraining), the data (the position information and the terminal information) of the terminal close to the terminal A, which is the target of the wireless quality estimation, is input to the pre-trained model, and the weight parameter is adjusted such that the output becomes the correct data (the wireless quality) of the terminal.

More specifically, the weight parameter of the pre-trained model becomes an initial value, only the weight parameter of the portion set as the retraining portion is adjusted, and the weight parameter of the portion other than the portion set as the retraining portion is maintained at the initial value. Alternatively, the learning rate of the portion other than the portion set as the retraining portion is set low to reduce the update amount of the weight parameter.

Note that the above example is an example of a learning method in retraining such as transfer learning, and is not limited to the above example.

In addition, in the transfer learning, a transfer trained model for each piece of terminal information (terminal type) may be generated. For example, from the same pre-trained model, a transfer trained model A1 is generated using data A1 of a terminal close to a terminal A1, and a transfer trained model A2 is generated using data A2 of a terminal close to a terminal A2. Then, for example, in a case where the terminal A2 is used as the terminal to be actually used, the wireless quality is estimated using the transfer trained model A2.

Examples of the terminal close to the terminal A, which is the target of the wireless quality estimation include the terminal A itself, a terminal of a device model the same as the terminal A, a terminal having a shape the same as the terminal A (a smartphone type, a mobile router type, or the like), a terminal mounted with a wireless communication chip having a model number the same as the model number of the wireless communication chip mounted on the terminal A, a terminal using wireless standards the same as the wireless standards used by the terminal A, a terminal whose antenna performance (gain, half-value width, and the like) falls under a difference within a certain range or less in comparison with the terminal A, and a terminal used under a use condition the same as the use condition assumed by the terminal A (walking, in-vehicle, or the like).

The measurement position of the terminal close to the terminal A is not necessarily geographically close to the position of the terminal A (the position to be estimated), and the measurement may be performed by the terminal close to the terminal A at a place different from the place where the terminal A exists.

The wireless quality of the terminal A can be more accurately estimated by using the transfer trained model obtained by performing learning again with the measurement data of the terminal close to the terminal A.

It is assumed that the data for retraining is less than other data. By performing retraining using data based on a terminal close to the terminal A with respect to the pre-trained model based on the measurement data of another terminal, wireless quality for the terminal A can be estimated with high accuracy even if there is little data based on a terminal close to the terminal A.

Operation Flow Example

Figure 6:
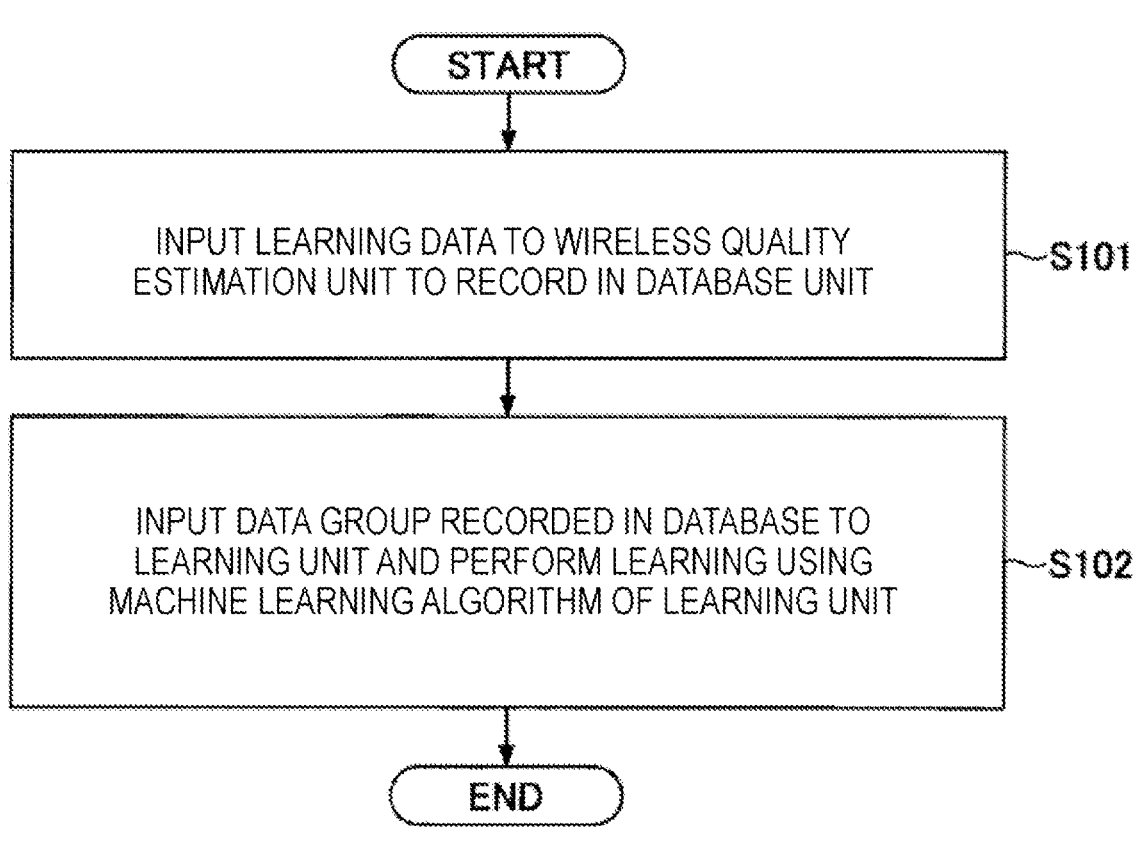
FIG. 6 is a diagram illustrating a flow at the time of learning of all terminal data.

An operation flow example of the wireless quality estimation device 100 in the present embodiment will be described with reference to FIGS. 6 to 8. FIG. 6 illustrates a flow at the time of pre-training of all terminal data.

In S101, the "location information, terminal information, and wireless quality information" for each terminal is input to the wireless quality estimation unit 120 as learning data and recorded in the database unit 122. Here, the measurement data obtained from various terminals is recorded in the database unit 122.

In S102, the learning unit 121 reads the data group from the database unit 122 and performs learning of the model using a machine learning algorithm. As a result, the pre-trained model is generated. The pre-trained model is held in the learning unit 121.

Figure 7:
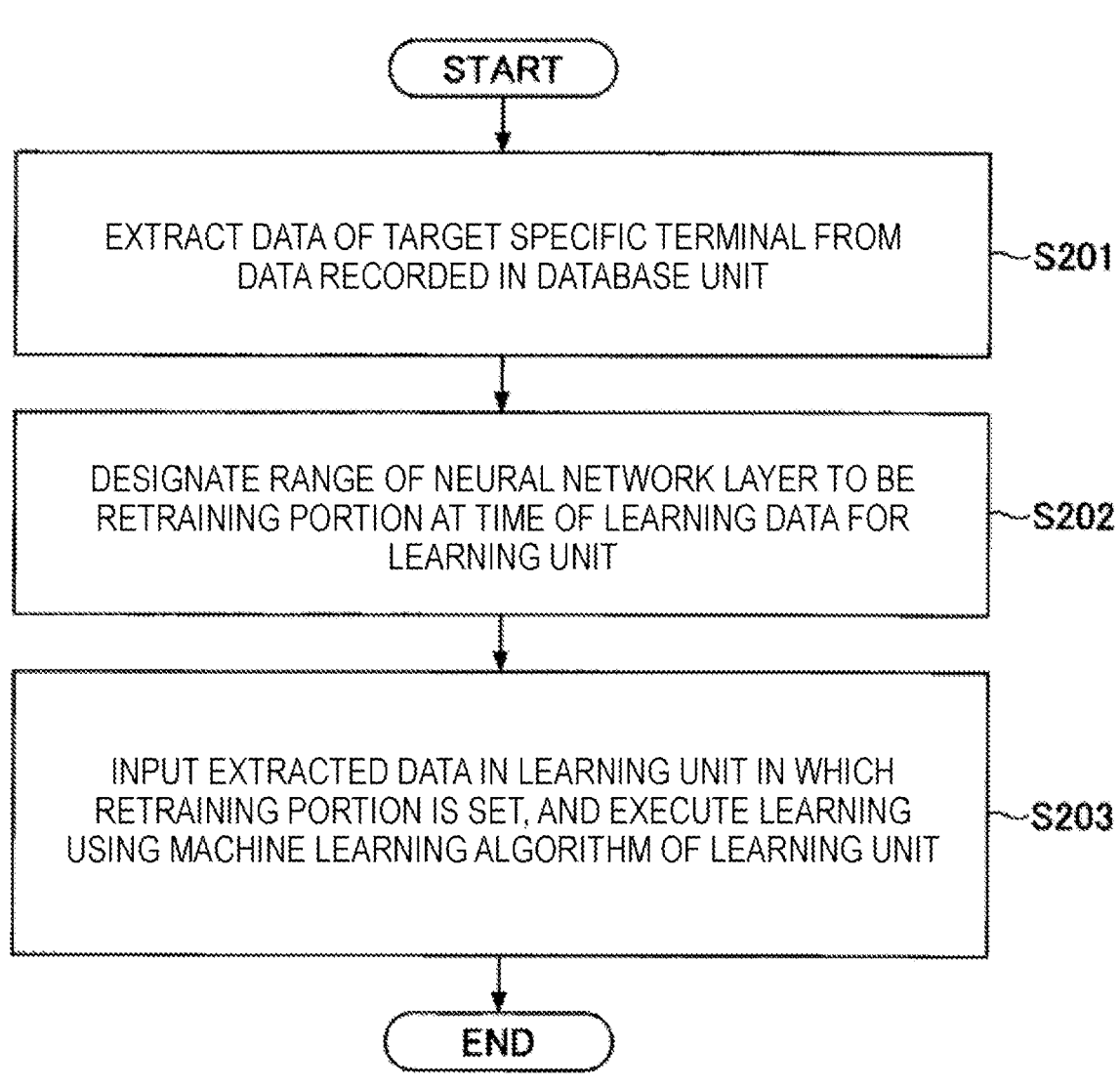
FIG. 7 is a diagram illustrating a flow at the time of learning of specific terminal data.

FIG. 7 illustrates a flow at the time of learning using specific terminal data.

In S201, the transfer learning control unit 123 extracts data of the target specific terminal (that is, the data of the terminal close to the terminal A) from the data recorded in the database unit 122.

In S202, the transfer learning control unit 123 designates the range of the layer of the neural network to be the retraining portion for the pre-trained model for the learning unit 121.

In S203, the transfer learning control unit 123 inputs the data extracted in S201 to the learning unit 121 in which the retraining portion is set. The learning unit 121 performs retraining on the pre-trained model using the data extracted in S201. As a result, a model on which the transfer learning has been performed is generated, and the learning unit 121 retains the model.

Figure 8:
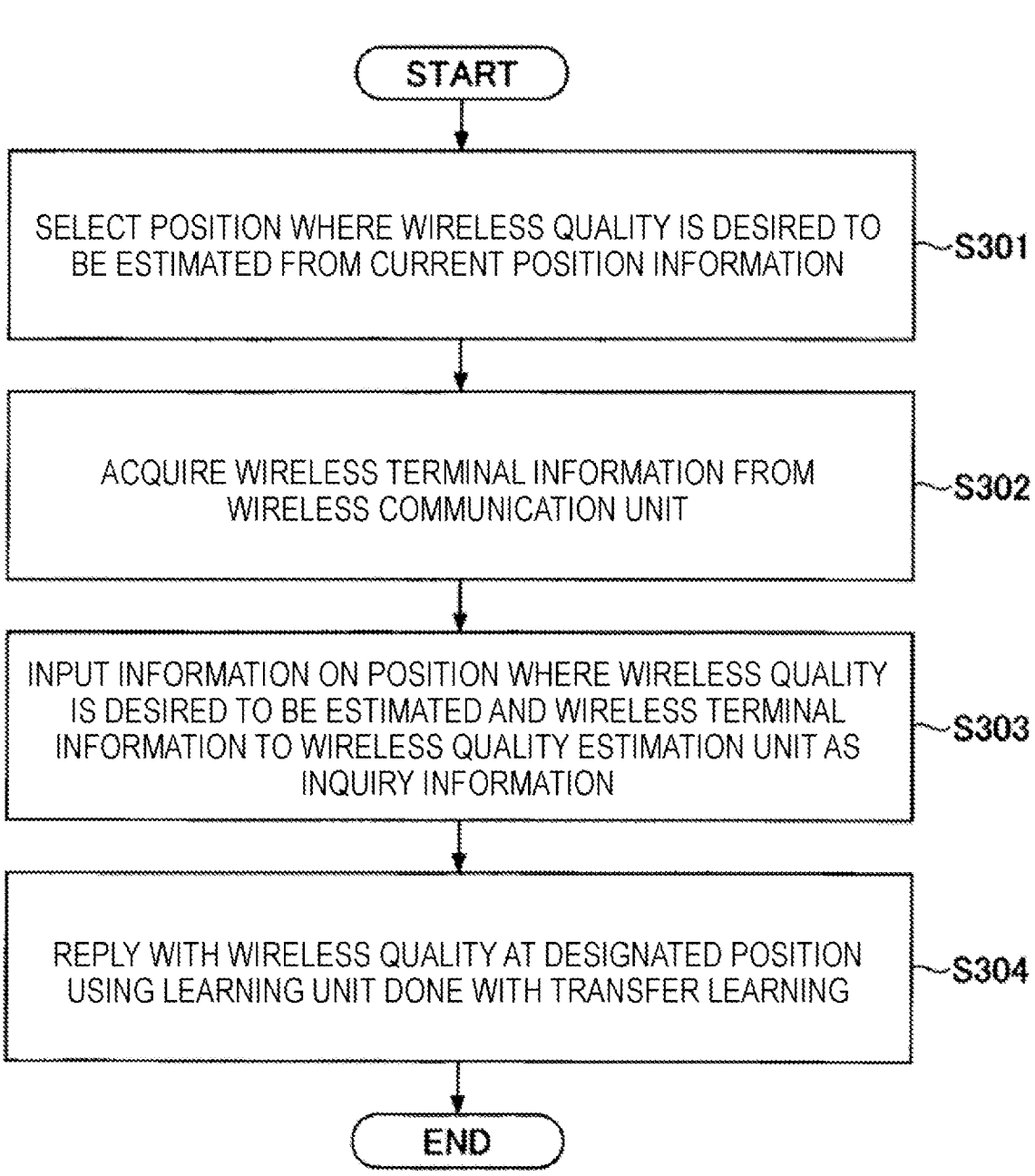
FIG. 8 is a diagram illustrating a flow at the time of quality estimation.

FIG. 8 illustrates a flow at the time of estimating the wireless quality for the terminal A.

In S301, the position information acquisition unit 111 acquires the current position information of the terminal A, and the estimated position designation unit 112 selects a position where the wireless quality is desired to be estimated for the terminal A based on the current position information.

In S302, the wireless terminal information acquisition unit 114 acquires the terminal information of the terminal A from the wireless communication unit 113. Here, it is assumed that the wireless communication unit 113 wirelessly acquires the terminal information from the terminal A.

In S303, the wireless quality management unit 110 inputs the information on the position where the wireless quality of the terminal A is desired to be estimated and the terminal information to the wireless quality estimation unit 120 as the inquiry information.

In S304, the wireless quality estimation unit 120 refers to the input terminal information, estimates the wireless quality at the designated position of the terminal A using the transfer trained model on which the transfer learning has been performed by the terminal close to the terminal A having the terminal information, and replies with the estimated value.

Hardware Configuration Example

Any of the devices (the terminal, the learning device, and the wireless quality estimation device) explained in the present embodiment can be implemented, for example, by a computer executing a program in which processing contents described in the present embodiment are described.

The above program can be stored and distributed by being recorded in a computer-readable recording medium (a portable memory or the like). Furthermore, the above program can also be provided through a network such as the Internet or an electronic mail.

Figure 9:
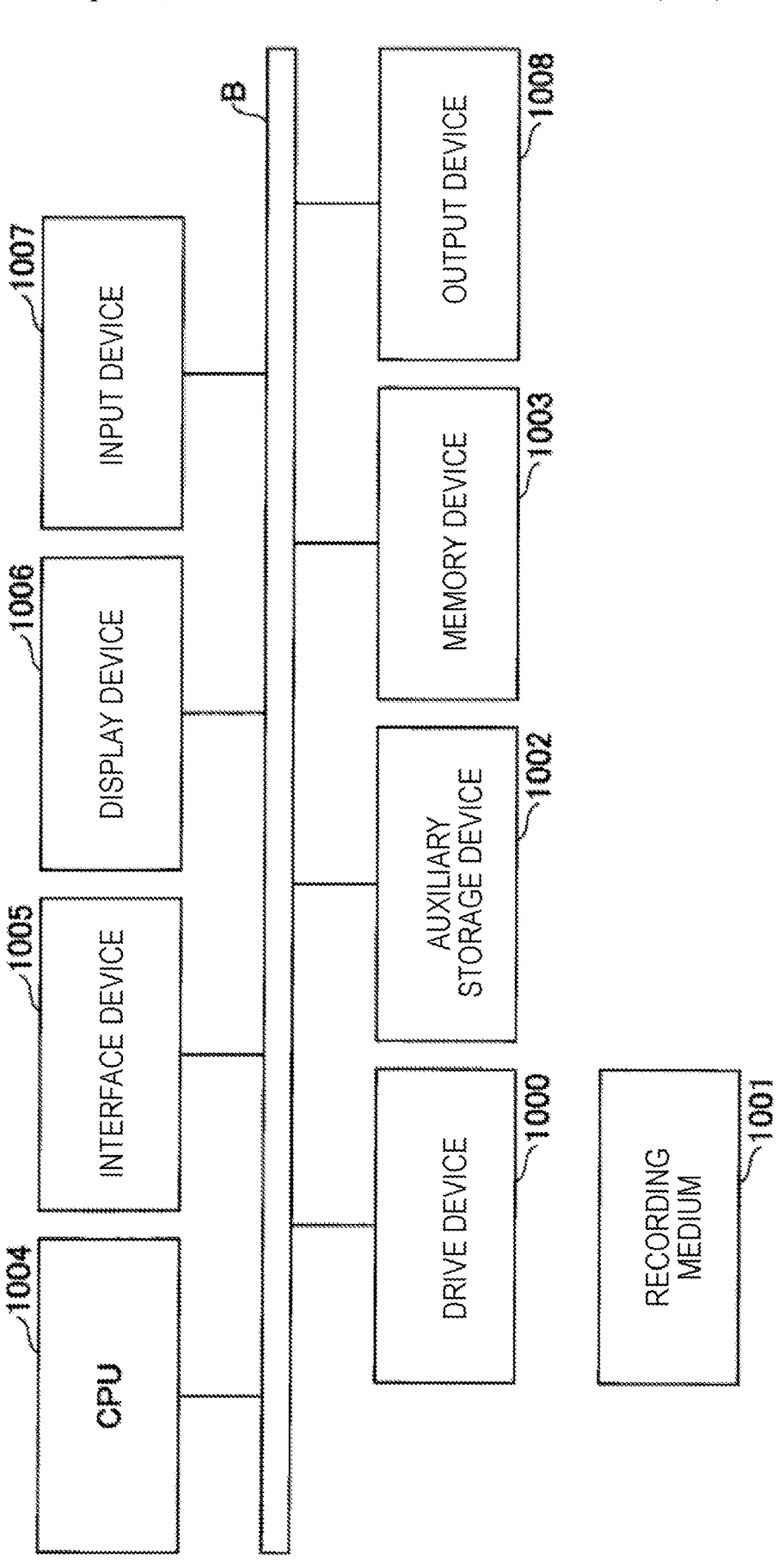
FIG. 9 is a diagram illustrating a hardware configuration example of a device.

FIG. 9 is a diagram illustrating a hardware configuration example of the above computer. The computer in FIG. 9 includes a drive device 1000, an auxiliary storage device 1002, a memory device 1003, a CPU 1004, an interface device 1005, a display device 1006, an input device 1007, an output device 1008, and the like, which are connected to each other by a bus B.

The program for implementing the processing in the computer is provided by a recording medium 1001 such as a CD-ROM or a memory card. When the recording medium 1001 storing the program is set in the drive device 1000, the program is installed from the recording medium 1001 to the auxiliary storage device 1002 via the drive device 1000. However, the program is not necessarily installed from the recording medium 1001, and may be downloaded from another computer via a network. The auxiliary storage device 1002 stores the installed program and also stores necessary files, data, and the like.

In a case where an instruction to start the program is received, the memory device 1003 reads and stores the program from the auxiliary storage device 1002. The CPU 1004 implements a function related to the device (the learning device, the wireless quality estimation device, and the like) in accordance with the program stored in the memory device 1003. The interface device 1005 is used as an interface for connecting to the network. The display device 1006 displays a graphical user interface (GUI) or the like by the program. The input device 1007 includes a keyboard and a mouse, buttons, a touch panel, or the like, and is used to input various operation instructions. The output device 1008 outputs a calculation result.

Effects of Embodiment

According to the technology of the present embodiment described above, the wireless quality can be accurately estimated even with the small amount of measurement data and actual data obtained under a desired condition.

Summary of Embodiment

In the present specification, at least a learning method, a wireless quality estimation method, a learning device, a wireless quality estimation device, or a program described in items described below is described.

(Item 1)

A learning method in which a learning device performs learning on a model for estimating wireless quality by machine learning, the learning method including:

a learning step of generating a pre-trained model by performing the learning on the model by using measurement data of wireless quality obtained by a plurality of terminals; and a retraining step of retraining the pre-trained model by using measurement data satisfying a predetermined condition.

(Item 2)

The learning method according to item 1, in which in the retraining step, measurement data of a specific terminal that is a target of the wireless quality estimation or measurement data of a terminal close to the specific terminal is extracted from the measurement data of the plurality of terminals, and the retraining is performed by using extracted measurement data.

(Item 3)

The learning method according to item 1 or 2, in which the model is a model for a neural network, and designates, in the retraining step, a range of neurons to be retrained in the pre-trained model.

(Item 4)

A wireless quality estimation method executed by a wireless quality estimation device, including steps of:

estimating a location of a terminal that is a target of wireless quality estimation; and estimating wireless quality at an estimated position of the terminal that is the target of the wireless quality estimation by using a model retrained by the learning method according to any one of items 1 to 3.

(Item 5)

A learning device that performs learning on a model for estimating wireless quality by machine learning, the learning device including:

a learning unit that generates a pre-trained model by performing the learning on the model by using measurement data of wireless quality obtained by a plurality of terminals; and a learning control unit that causes the learning unit to retrain the pre-trained model by using measurement data satisfying a predetermined condition.

(Item 6)

A wireless quality estimation device, including:

a position estimation unit that estimates a position of a terminal that is a target of wireless quality estimation; and a wireless quality estimation unit that estimates wireless quality at an estimated position of the terminal that is the target of the wireless quality estimation by using a model generated by retraining, by using measurement data satisfying a predetermined condition, a pre-trained model learned by using measurement data of wireless quality obtained by a plurality of terminals.

(Item 7)

A program for causing a computer to function as each unit of the learning device according to item 5.

(Item 8)

A program for causing a computer to function as each unit of the wireless quality estimation device according to item 6.

Although the present embodiment has been described above, the present invention is not limited to such a specific embodiment, and various modifications and changes can be made within the scope of the gist of the present invention described in the claims.

REFERENCE SIGNS LIST 100 wireless quality estimation device
110 wireless quality management unit
111 position information acquisition unit
112 estimated position designation unit
113 wireless communication unit
114 wireless terminal information acquisition unit
120 wireless quality estimation unit
121 learning unit
122 database unit
123 transfer learning control unit
1231 retraining data selection unit for a specific terminal
1232 retraining layer setting unit
124 input unit
125 inquiry information input unit
126 estimated value output unit
1000 drive device
1001 recording medium
1002 auxiliary storage device
1003 memory device
1004 CPU
1005 interface device
1006 display device
1007 input device
1008 output device

The invention claimed is:

1. A learning method for a learning device that performs learning on a model for estimating wireless quality by machine learning, the learning method comprising:

generating a pre-trained model by performing the learning on the model by using measurement data of wireless quality obtained by a plurality of terminals;

determining whether measurement data satisfy a predetermined condition, said condition is satisfied if the measurement data is acquired from a terminal including a wireless communication chip having a same model number as a model number of a wireless communication chip that is included in a terminal that is a target of wireless quality estimation, and retraining the pre-trained model by using the measurement data satisfying the predetermined condition, wherein the retraining includes extracting measurement data of a specific terminal that is a target of the wireless quality estimation or measurement data of a terminal close to the specific terminal from the measurement data of the plurality of terminals, and performing the retraining by using the extracted measurement data, wherein the measurement data used for retraining is extracted based on terminal information and position information, and wherein the terminal information includes at least one of a device model, a wireless communication standard, antenna performance, or a model number of the wireless communication chip such that a terminal from which the measurement data is acquired is close to the terminal that is the target of wireless quality estimation.

2. The learning method according to claim 1, wherein the model is for a neural network, and the retraining includes designating a range of neurons to be retrained in the pre-trained model.

3. A wireless quality estimation method executed by a wireless quality estimation device, comprising:

estimating a location of a terminal that is a target of wireless quality estimation; and estimating wireless quality at an estimated position of the terminal that is the target of the wireless quality estimation by using the model retrained by the learning method according to claim 1.

4. A learning device that performs learning on a model for estimating wireless quality by machine learning, the learning device comprising:

a processor; and a memory storing program instructions that cause the processor to:

generate a pre-trained model by performing the learning on the model by using measurement data of wireless quality obtained by a plurality of terminals;

determine whether the measurement data satisfy a predetermined condition, said condition is satisfied if the measurement data is acquired from a terminal including a wireless communication chip having a same model number as a model number of a wireless communication chip that is included in a terminal that is a target of wireless quality estimation, and retrain the pre-trained model by using measurement data satisfying the predetermined condition, wherein the processor is further caused to extract measurement data of a specific terminal that is a target of the wireless quality estimation or measurement data of a terminal close to the specific terminal from the measurement data of the plurality of terminals, and perform the retraining by using the extracted measurement data, wherein the measurement data used for retraining is extracted based on terminal information and position information, and wherein the terminal information includes at least one of a device model, a wireless communication standard, antenna performance, or a model number of the wireless communication chip such that a terminal from which the measurement data is acquired is close to the terminal that is the target of wireless quality estimation.

5. A wireless quality estimation device, comprising:

a processor; and a memory storing program instructions that cause the processor to:

estimate a position of a terminal that is a target of wireless quality estimation; and estimate wireless quality at an estimated position of the terminal that is the target of the wireless quality estimation by using a model generated by determining whether measurement data satisfy a predetermined condition, said condition is satisfied if the measurement data is acquired from a terminal including a wireless communication chip having a same model number as a model number of a wireless communication chip that is included in a terminal that is a target of wireless quality estimation and retraining, by using the measurement data satisfying the predetermined condition, a pre-trained model obtained by performing machine learning by using measurement data of wireless quality obtained by a plurality of terminals, wherein the retraining includes extracting measurement data of a specific terminal that is a target of the wireless quality estimation or measurement data of a terminal close to the specific terminal from the measurement data of the plurality of terminals, and performing the retraining by using the extracted measurement data, wherein the measurement data used for retraining is extracted based on terminal information and position information, and wherein the terminal information includes at least one of a device model, a wireless communication standard, antenna performance, or a model number of the wireless communication chip such that a terminal from which the measurement data is acquired is close to the terminal that is the target of wireless quality estimation.

6. A non-transitory computer-readable recording medium having stored therein a program for causing a computer to perform the learning method according to claim 1.

7. A non-transitory computer-readable recording medium having stored therein a program for causing a computer to perform the wireless quality estimation method according to claim 3.

8. The learning method according to claim 2, wherein the retraining includes updating only three intermediate layers located immediately before an output layer of the neural network included in the pre-trained model.

* * * * *